(12) United States Patent
Dönitz et al.

(10) Patent No.: US 8,283,641 B2
(45) Date of Patent: Oct. 9, 2012

(54) POSITIONING DEVICE FOR A PARTICLE BEAM APPARATUS

(75) Inventors: Dietmar Dönitz, Aalen (DE); Dirk Preixszas, Oberkochen (DE); Michael Steigerwald, Westhausen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 249 days.

(21) Appl. No.: 12/454,268

(22) Filed: May 14, 2009

(65) Prior Publication Data

US 2010/0044566 A1 Feb. 25, 2010

(30) Foreign Application Priority Data

May 15, 2008 (DE) .......... 10 2008 001 812

(51) Int. Cl.
*H01J 37/26* (2006.01)
(52) U.S. Cl. ..................... 250/492.1; 250/310
(58) Field of Classification Search .......... 250/310, 250/492.1, 492.2
See application file for complete search history.

(56) References Cited

U.S. PATENT DOCUMENTS

| | | | |
|---|---|---|---|
| 2,944,172 A | 7/1960 | Opitz et al. | |
| 3,303,319 A | 2/1967 | Steigerwald | |
| 4,990,776 A | 2/1991 | Fushimi et al. | |
| 5,025,165 A | 6/1991 | Chen et al. | |
| 5,168,166 A | 12/1992 | Hayakawa et al. | |
| 5,216,235 A | 6/1993 | Lin | |
| 5,598,002 A | 1/1997 | Todokoro et al. | |
| 5,614,713 A | 3/1997 | Kobaru et al. | |
| 6,310,341 B1 * | 10/2001 | Todokoro et al. | 250/305 |
| 6,621,082 B2 | 9/2003 | Morita et al. | |
| 6,714,289 B2 | 3/2004 | Haraguchi | |
| 6,855,939 B2 | 2/2005 | Rose et al. | |
| 6,881,687 B1 | 4/2005 | Castrucci | |
| 7,148,073 B1 | 12/2006 | Soltz et al. | |
| 7,205,542 B1 | 4/2007 | Mankos et al. | |
| 7,601,954 B2 * | 10/2009 | Nishiyama et al. | 250/310 |
| 7,888,643 B2 | 2/2011 | Albiez | |

(Continued)

FOREIGN PATENT DOCUMENTS

DE 11 19 428 12/1961

(Continued)

OTHER PUBLICATIONS

Machine Translation of JP 51-113468 A published Oct. 6, 1976.

*Primary Examiner* — Kiet T Nguyen
(74) *Attorney, Agent, or Firm* — Muirhead and Saturnelli, LLC (57) ABSTRACT

A positioning device and a particle beam apparatus including a positioning device ensure reliable positioning of a holder for holding an object at any working distance. The positioning device includes a positionable holder for holding the object. A light source generates a light beam which is guided in the direction of the positionable holder. A detector detects the light beam. An injection area injects particles of a particle beam such that they are guided in the direction of the positionable holder. The light beam passes the injection area. The injection area has an output side for the light beam and the particle beam, which is directed toward the holder. The detector includes a detector element situated in an area between the output side and the holder. The light source includes a light source element situated in an area which extends away from the holder, starting from the output side.

32 Claims, 9 Drawing Sheets

U.S. PATENT DOCUMENTS

| | | |
|---|---|---|
| 2002/0050489 A1 | 5/2002 | Ikegami et al. |
| 2002/0190207 A1 | 12/2002 | Levy et al. |
| 2003/0006372 A1 | 1/2003 | Morita et al. |
| 2003/0025087 A1 | 2/2003 | Schamber et al. |
| 2004/0211919 A1 | 10/2004 | Tanaka et al. |
| 2008/0185509 A1 | 8/2008 | Knowles |

FOREIGN PATENT DOCUMENTS

| | | |
|---|---|---|
| DE | 102006047729 A1 | 8/2007 |
| EP | 0 254 128 A2 | 1/1988 |
| EP | 0 254 128 A3 | 1/1988 |
| EP | 0 849 765 A2 | 6/1998 |
| EP | 1 724 809 A1 | 11/2006 |
| EP | 1 956 633 A2 | 8/2008 |
| EP | 2 061 067 A2 | 5/2009 |
| JP | 51-113468 | 10/1976 |
| JP | 10-223168 | 8/1998 |
| JP | 10-312765 | 11/1998 |

* cited by examiner

POSITIONING DEVICE FOR A PARTICLE BEAM APPARATUS

TECHNICAL FIELD

This application relates to a positioning device for a particle beam apparatus as well as a particle beam apparatus including the positioning device.

BACKGROUND OF THE INVENTION

In particle beam devices, an object may be precisely positioned in order to be examined. After all, this is the way to select interesting areas of an object and to examine them using a particle beam. The use of a holder in the form of an object stage which is adjustable in three directions arranged perpendicular to each other and on which an object to be examined is situated, has long been known for positioning an object. The object stage may also be rotated around a first axis and/or tilted around a second axis.

To roughly position the object stage, and thus the object, with regard to a particle beam, a positioning auxiliary device for a particle-optical scanning microscope is known from DE 10 2006 047 729 A1, which is incorporated herein by reference, the particle-optical scanning microscope being provided with an objective which defines a particle-optical beam axis and also with an object stage. The known positioning auxiliary device includes a light source in the form of an illumination device for generating a light beam at a first angle relative to the particle-optical beam axis. The light beam intersects the particle-optical beam axis at a predefined position. The known positioning auxiliary device is also provided with a detector in the form of a camera, which is sensitive to the wavelength of the light beam and which is used to take a photo of an object situated on the object stage at a second angle relative to the particle-optical beam axis. In addition, the known positioning auxiliary device includes a display and a control device for generating a photo taken by the camera on the display, together with a mark which indicates the position of the particle-optical beam axis in the photo. Using the known positioning auxiliary device, it is possible to roughly position the object stage with regard to a particle beam. The object stage is adjustable in a plane which is perpendicular to the particle beam incident upon the object. However, it is possible to position the object stage with sufficient accuracy only if the distance of the plane of the object situated on the object stage is equal to the working distance predefined by the objective. Positioning at a different working distance is not provided.

Reference is also made to U.S. Pat. No. 7,205,542 B1 that discloses a scanning electron microscope with curved axes and which is incorporated herein by reference.

Accordingly, it would be desirable to specify a positioning device and a particle beam apparatus including a positioning device which ensure reliable and sufficient positioning of a holder for holding an object or for positioning the object at any working distance.

SUMMARY OF THE INVENTION

According to the system described herein, a positioning device for a particle beam apparatus includes at least one positionable holder for holding an object. A positionable holder is understood to be a holder which is adjustable in at least two and perhaps three directions arranged perpendicular to each other. In addition, the positionable holder may be rotatable around a first axis and/or tiltable around a second axis. The positioning device according to the system described herein may also be provided with at least one light source for generating a light beam which may be guided in the direction of the positionable holder. Furthermore, the positioning device has at least one detector for detecting the light beam. The detector may be CCD camera. In addition, at least one injection area is provided in which particles of a particle beam may be injected in such a way that they may be guided in the direction of the positionable holder. The light beam of the light source passes through the injection area. The injection area also has an output side directed toward the holder for the light beam and the particle beam. Furthermore, the detector is provided with a detector element which is situated in an area between the output side and the holder, while the light source has a light source element which is situated in an area which extends away from the output side of the holder.

The system described herein ensures that the light beam and the particle beam of a particle beam apparatus are able to run coaxially or approximately coaxially to each other, for example on a particle-optical axis of the particle beam apparatus. If the light beam and the particle beam follow approximately coaxial paths, the angle between them is less than or equal to 15°, specifically less than or equal to 10° and even more specifically less than or equal to 5°. The light beam therefore illuminates an object at any working distance which is predefined by an objective precisely at the point on the object which is located in the field of vision of a particle beam apparatus. It is therefore possible to precisely and sufficiently position the holder or an object situated on the holder at any predefined working distance.

The detector element may be situated on the detector and/or the light source element may be situated on the light source. In other words, it is provided that the detector element is located at the position of the detector and/or the light source element is located at the position of the light source. The detector element and the detector may be designed as a single piece (at least in one housing). The same may be provided for the light source element and the light source. Alternatively, it is provided that the detector element is located at a position other than the position of the detector and/or the light source element is located at a position other than the position of the light source. Accordingly, it is provided to position the detector element separately from the detector and/or to position the light source element separately from the light source. The detector element and/or the light source element may be a deflection element(s), for example mirrors.

The injection area may be situated on a particle-optical axis of a particle beam apparatus. In this exemplary embodiment, both the light beam and the injectable particles are guided along the particle-optical axis, at least, however, along a portion of the particle-optical axis. In some exemplary embodiments, the particle-optical axis is situated vertically in a particle beam apparatus. In alternative exemplary embodiments, however, it is also provided to situate the particle-optical axis horizontally. According to yet other exemplary embodiments, the particle-optical axis is situated both partially vertically and partially horizontally. However, the design of the particle-optical axis is not limited to the aforementioned exemplary embodiments. Instead, it is possible to use any particle-optical axis which is predefined by a particle beam apparatus which is suitable for the system described herein.

In a further embodiment of the positioning device according to the system described herein, the light source may be situated on the particle-optical axis of a particle beam apparatus (or at least on an extension of the particle-optical axis—therefore, the term "particle-optical axis" is hereinafter understood to also include the extension thereof). For example, the light source is situated on a vertical particle-optical axis in such a way that the injection area is connected downstream to the light source—viewed from the light source in the direction of the object. This embodiment effectively ensures that a particle beam and the light beam are oriented coaxially to each other.

Alternatively or in addition to the aforementioned embodiment, the positioning device according to the system described herein includes at least one guide device which may be used to guide the light beam onto the particle-optical axis. The guide device may be a deflection element, in particular a mirror element or a prism. According to this embodiment, for example, the light source may be situated next to the particle-optical axis, and the light beam may be directed onto the particle-optical axis by a deflection element in such a way that the light beam and the particle beam are oriented coaxially to each other.

In a further embodiment of the positioning device according to the system described herein, at least one deflector may be provided for injecting the particles of the particle beam. The deflector may be a beam splitter. Alternatively or in addition, the deflector may be a deflection system which includes multiple deflection units. The deflector or the individual components thereof (in particular, the aforementioned deflection units) may be provided with a magnetic or electrostatic design. According to further embodiments, the deflector includes electrostatic and magnetic deflection units. The deflector thus provides at least one deflection field which influences the particles of a particle beam. The deflector ensures that particles of a particle beam are deflected from a first direction to a second direction (for example, in the direction of and along a particle-optical axis). According to this embodiment, it is possible, for example, to situate the light source (or an injection area of the light beam of the light source on the particle-optical axis) upstream from the injection area of the particles of a particle beam—viewed from the light source in the direction of an object—so that both the light beam and the particle beam run along the same axis, i.e., coaxially to each other.

The deflector may be provided with multiple deflection elements which are situated essentially semi-circularly. It may also be advantageous to assign a mirror corrector to the deflector.

In a further embodiment of the positioning device according to the system described herein, the light beam of the light source has two functions. On the one hand, it is provided for positioning the positionable holder, as explained above. On the other hand, however, the light beam is provided for cleaning an object situated on the positionable holder. As a result, contamination present on the object is removed by the light beam of the light source. If necessary, a gas (such as nitrogen or argon) is passed over the object in addition to the light beam for the purpose of removing contamination from the object which was loosened from the object by the light beam.

The light source may be a laser. A low-power laser is entirely suitable for positioning the positionable holder. A high-power laser may also be used as an alternative thereto. This ensures that the aforementioned cleaning is carried out properly and particularly effectively. As an alternative thereto, the light source may be a simple incandescent bulb. The light beam which is generated by an incandescent bulb and is also focused, if necessary, is also well suited for positioning the positionable holder. Reference is hereby explicitly made to the fact that the light source is not limited to the aforementioned exemplary embodiments. Instead, it is possible to use any illuminant which is suitable as a light source according to the system described herein.

In a further embodiment of the positioning device according to the system described herein, at least two light sources are provided for generating a light beam, namely a first light source for generating a first light beam and a second light source for generating a second light beam. The two light sources have different functions. The first light beam is provided for positioning the positionable holder. The second light beam, on the other hand, is provided for cleaning an object situated on the positionable holder. The first light source may be a low-power laser, while the second light source may be a high-power laser, which is preferred for cleaning. It may also be provided that one of the two light sources is situated on the particle-optical axis, while the other of the two light sources is situated next to the particle-optical axis, the light beam thereof being injected into the particle-optical axis via a deflection element in such a way that this light beam passes along the particle-optical axis coaxially to the particle beam. In an alternative embodiment, the light beams of the first light source and the second light source are injected into the particle-optical axis via deflection elements assigned to the first light source and the second light source.

In a further embodiment of the system described herein, the positioning device is provided with a distance measuring system. For this purpose, a further detector may be assigned to the positioning device. This detector is situated in such a way that it detects light reflected by an object situated on the holder. For example, the further detector is situated along the particle-optical axis. Based on travel time measurements and/or evaluations of a phase modulation, it is possible to precisely determine the distance between the detector and the holder or the object. However, this embodiment is not limited to the use of a further detector. Instead, a distance measurement may also be carried out using the aforementioned detector.

The system described herein also relates to a particle beam apparatus, in particular a scanning electron microscope, which includes a positioning device having at least one of the aforementioned features or one of the aforementioned feature combinations. In particular, the particle beam apparatus according to the system described herein is provided with at least one particle beam generator for generating a particle beam, with at least one positionable holder for holding an object as well as with at least one objective for focusing the particle beam onto the object. The particle beam apparatus according to the system described herein also includes at least one light source for generating a light beam which is used to illuminate the object, as well as at least one detector for detecting the light beam. The detector may be a CCD camera which is sensitive to the wavelength of the light beam. In addition, the particle beam apparatus according to the system described herein is provided with at least one injection area for injecting the particle beam in such a way that the particle beam may be guided in the direction of the positionable holder. The light beam of the light source passes through the injection area. The injection area also has an output side directed toward the holder for the light beam and the particle beam. Furthermore, the detector is provided with a detector element which is situated in an area between the output side and the holder, while the light source includes a light source element which is situated in an area that extends away from the output side of the holder.

The particle beam apparatus according to the system described herein has the same advantages as the positioning device according to the system described herein, so that reference is hereby made to the aforementioned explanatory notes. The same applies to the advantages of the exemplary embodiments of the particle beam apparatus according to the system described herein, which are explained below.

In a first exemplary embodiment of the particle beam apparatus according to the system described herein, the detector element is situated on the detector and/or the light source element is situated on the light source. In other words, it is provided that the detector element is located at the position of the detector and/or the light source element is located at the position of the light source. The detector element and the detector may be designed as a single piece. The same may be provided for the light source element and the light source. Alternatively, it is provided that the detector element is located at a position other than the position of the detector and/or the light source element is located at a position other than the position of the light source. Accordingly, it is provided to position the detector element separately from the detector and/or to position the light source element separately from the light source. The detector element and/or the light source element may be deflection element(s), for example mirrors.

In a further exemplary embodiment of the particle beam apparatus according to the system described herein, the injection area is situated on a particle-optical axis of the particle beam apparatus. Both the light beam and the particle beam are guided on the particle-optical axis. In addition, the light beam and the particle beam may be guided in relation to each other in such a way that they are oriented coaxially or at least approximately coaxially to each other, reference being also hereby made to the discussion above.

In a further embodiment of the particle beam apparatus according to the system described herein, the light source is situated on the particle-optical axis (or the extension thereof; see above for a definition).

A guide device may also be provided, which may be used to guide the light beam of the light source onto the particle-optical axis. The guide device may be a deflection element, in particular a mirror element or a prism.

Any light source arrangement may be selected, provided that the light beam passes through the injection area. In a particular embodiment of the particle beam apparatus according to the system described herein, it is provided, for example, to guide the light beam through pole shoes of the deflector or beam splitter and to subsequently inject it into the particle-optical axis in such a way that the light beam passes through the injection area.

In a further embodiment of the particle beam apparatus according to the system described herein, at least one deflector is provided for injecting the particle beam. The deflector may be designed in the same manner as described above.

In another embodiment, the particle beam apparatus according to the system described herein may be designed in such a way that the light beam is provided both for positioning the positionable holder and for cleaning the object situated on the positionable holder. In particular, it is provided to design the light source as a laser. Reference is hereby made to the aforementioned explanatory notes.

According to a further exemplary embodiment of the particle beam apparatus according to the system described herein, the particle beam apparatus includes at least one sample chamber in which the positionable holder is situated. The detector is situated within the sample chamber. Alternatively or in addition thereto, it is provided to situate the detector outside the sample chamber. The last few embodiments mentioned have the advantage that the detector does not have to be integrated into a vacuum system, which is usually provided in a particle beam apparatus.

In a further exemplary embodiment of the particle beam apparatus according to the system described herein, at least two light sources are provided for generating a light beam, namely a first light source for generating a first light beam and a second light source for generating a second light beam. The two light sources have different functions. The first light beam is provided for positioning the object situated on the positionable holder, while the second light beam is provided for cleaning the object situated on the positionable holder.

In a further embodiment of the particle beam apparatus according to the system described herein, a distance measuring system is provided. For this purpose, a further detector may be assigned to the particle beam apparatus. This detector is situated in such a way that it detects light reflected by an object situated on the holder. For example, the further detector is situated along the particle-optical axis. Based on travel time measurements and/or evaluations of a phase modulation, it is possible to precisely determine the distance between the detector and the holder or the object. However, this embodiment is not limited to the use of a further detector. Instead, a distance measurement may also be carried out using the aforementioned detector.

The particle beam apparatus may be a scanning particle beam apparatus, for example a scanning electron microscope. However, the system described herein is not limited thereto. Instead, the particle beam apparatus may be any type of particle beam apparatus, for example an ion beam apparatus.

BRIEF DESCRIPTION OF THE DRAWINGS

Embodiments of the system described herein will be explained in greater detail below based on the figures, which are briefly described as follows.

DETAILED DESCRIPTION OF VARIOUS EMBODIMENTS

The system described herein is explained below on the basis of a particle beam apparatus in the form of a scanning electron microscope. However, reference is expressly made to the fact that the system described herein is not limited to a scanning electron microscope. Instead, the positioning device according to the system described herein may be used in any particle beam apparatus. The particle beam apparatus according to the system described herein may also be of any type, for example an ion beam apparatus.

Figure 1A:
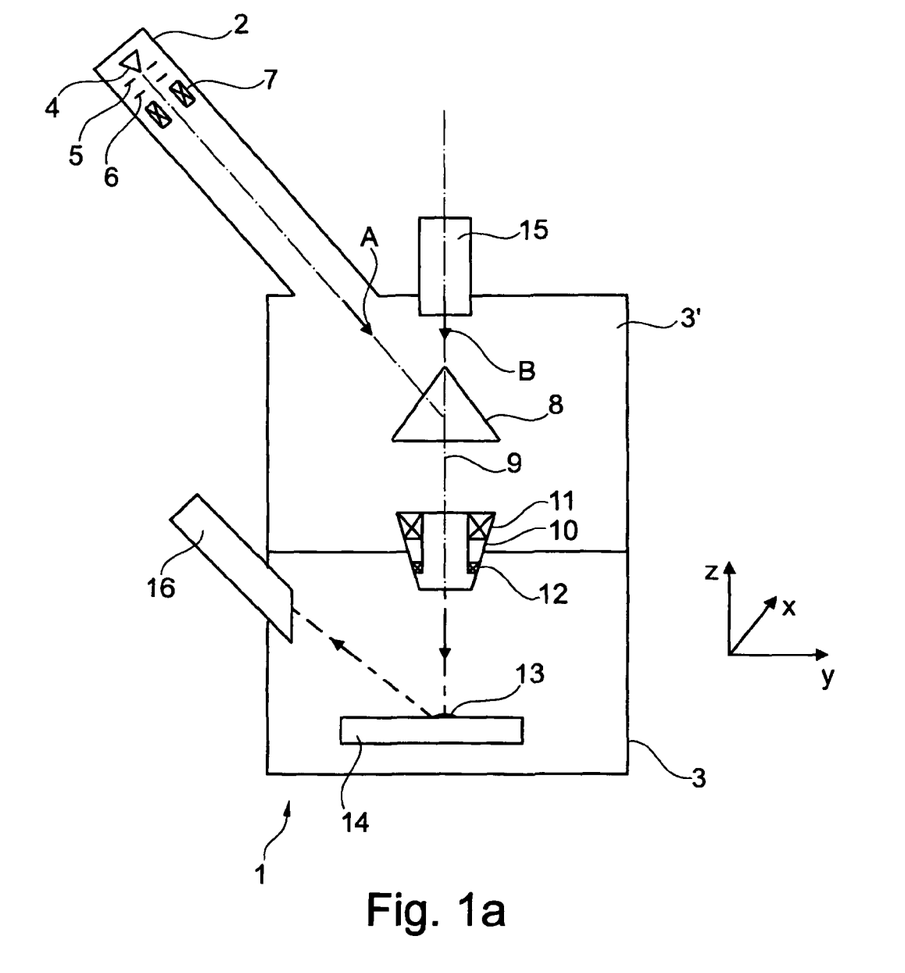
FIG. 1a shows a schematic representation of a particle beam apparatus including a sample chamber, a light source, and a camera, which extends into the sample chamber.

FIG. 1a shows a schematic representation of a particle beam apparatus in the form of a scanning electron microscope 1. The scanning electron microscope 1 includes an electron column 2 to which an electron column chamber 3' is connected. The electron column 2 is situated in such a way that it may be tilted approximately 30° to 90° in relation to the vertical, the system described herein not being limited to the aforementioned angle range. If a tilted arrangement of the electron column 2 is desired, any angle range suitable therefor may be selected. A sample chamber 3, which is described in greater detail below, is connected to the electron column chamber 3'.

A particle beam generator 4, which emits electrons, is situated in the electron column 2. For example, the particle beam generator 4 may be a thermal field emission source or a cold field emission source. Using an electrode system that includes two electrodes 5 and 6, to which a suitable potential is applied, electrons are extracted from the particle beam generator 4 and accelerated to a desired energy. A particle beam composed of the electrons is formed with the aid of a condenser lens 7, which in this exemplary embodiment is a magnetic lens.

The particle beam generated in this manner runs in arrow direction A to a coil element designed as a deflection element 8. In the exemplary embodiment illustrated according to FIG. 1a, the deflection element 8 may be a magnetic deflection element. In an alternative embodiment, the deflection element 8 may be an electrostatic deflection element. In a further embodiment, it is provided that the deflection element 8 is both a magnetic and an electrostatic deflection element. In other embodiments, the deflection element 8 may include other types of deflectors. The deflection element 8 of the exemplary embodiment illustrated in FIG. 1a provides a magnetic field in such a way that the particle beam is deflected onto a particle-optical axis 9 of the scanning electron microscope 1 and runs in the direction of an objective lens 10. The objective lens 10 is used to focus the particle beam onto an object 13, as explained below. The objective lens 10 may be a magnetic lens and therefore have a magnet coil 11. A deflection device 12, which is used to scan the particle beam focused by the objective lens 10 over the object 13, is situated on the objective lens 10.

As mentioned above, the sample chamber 3, which may be designed to be separate from the electron column chamber 3', may be connected to the electron column chamber 3'. However, the objective lens 10 may extend slightly into the sample chamber 3. The object 13 is situated on a holder 14 in the form of an object stage in the sample chamber 3. The holder 14 is adjustable, and therefore positionable, in at least three directions x, y and z (coordinate system is illustrated) which are situated perpendicular to each other. In further embodiments, the holder 14 is additionally rotatable around a first axis which is parallel to the particle-optical axis 9 and/or tiltable around a second axis which is perpendicular to the particle-optical axis 9. In additional embodiments, which are not illustrated, further rotary axes are provided, which are situated perpendicular to the aforementioned rotation axes and/or tilting axes.

When the particle beam strikes the object 13, interaction particles, in particular secondary electrons and backscattered electrons, are produced as a result of the interactions. These electrons are then used for imaging purposes (not illustrated).

The holder 14 is part of a positioning device according to the system described herein, which additionally includes a light source 15 situated on the electron column chamber 3' and a CCD camera 16 situated in sample chamber 3. The CCD camera 16 is designed in such a way that it is sensitive to the wavelength of a light beam which is generated by the light source 15.

The light source 15 is situated on the extension of the particle-optical axis 9, above the injection area of the particles in the form of electrons, the injection area being the deflection element 8. This makes it possible for the light beam generated by the light source 15 to travel along the particle-optical axis 9 in arrow direction B. The light beam thus also passes through the deflection element 8. Injecting the particle beam into the particle-optical axis 9, viewed in the beam direction of the particle beam, after the light beam has been injected, therefore ensures that the light beam and the particle beam run coaxially to each other. The area of the object 13 is precisely illuminated by the light beam in this manner and recorded by the CCD camera 16, which is also made visible by the aforementioned electron imaging process. The light beam therefore illuminates the object 13 at any working distance, which is predefined by the objective lens 10, precisely at the point on the object 13 which is located in the field of vision of the scanning electron microscope 1. It is therefore possible to precisely and sufficiently position the holder 14 at any predefined working distance.

Figure 1B:
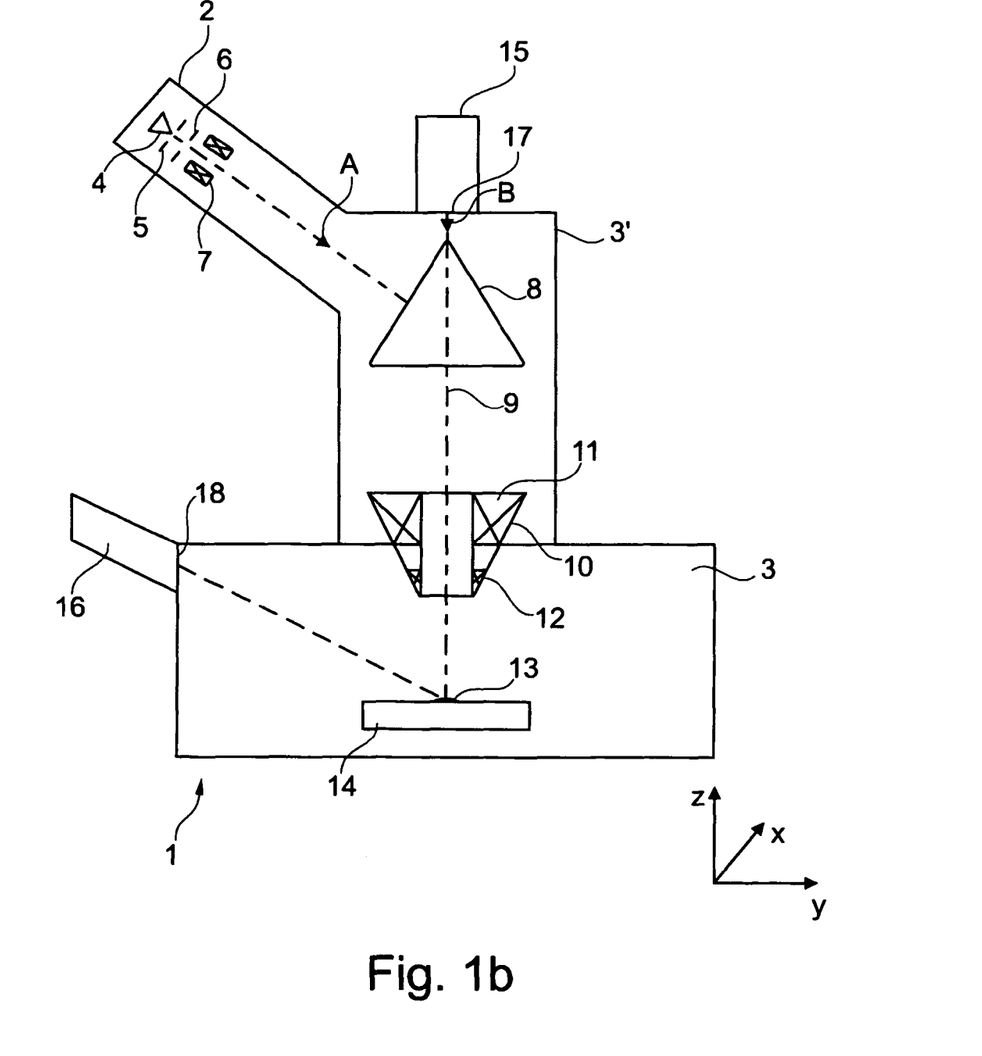
FIG. 1b shows a schematic representation of a further particle beam apparatus including a sample chamber, a light source, and a camera, which is situated on the sample chamber.

FIG. 1b shows a further schematic representation of a particle beam apparatus in the form of the scanning electron microscope 1, which corresponds to the exemplary embodiment according to FIG. 1a. The same components are provided with the same reference numerals. The embodiment according to FIG. 1b differs from the exemplary embodiment according to FIG. 1a in that the light source 15 is situated outside the electron column chamber 3'. The CCD camera 16 is also not located within the sample chamber 3, but is situated outside the sample chamber 3. To enable the passage of the light beam generated by the light source 15, a window 17 is provided on the electron column chamber 3'. The same applies to the CCD camera 16. In this case, a window 18 is provided on sample chamber 3 for the light reflected by the object 13. The electron column chamber 3' according to FIG. 1b also has a slightly narrower design than does the electron column chamber 3' in FIG. 1a.

Figure 2A:
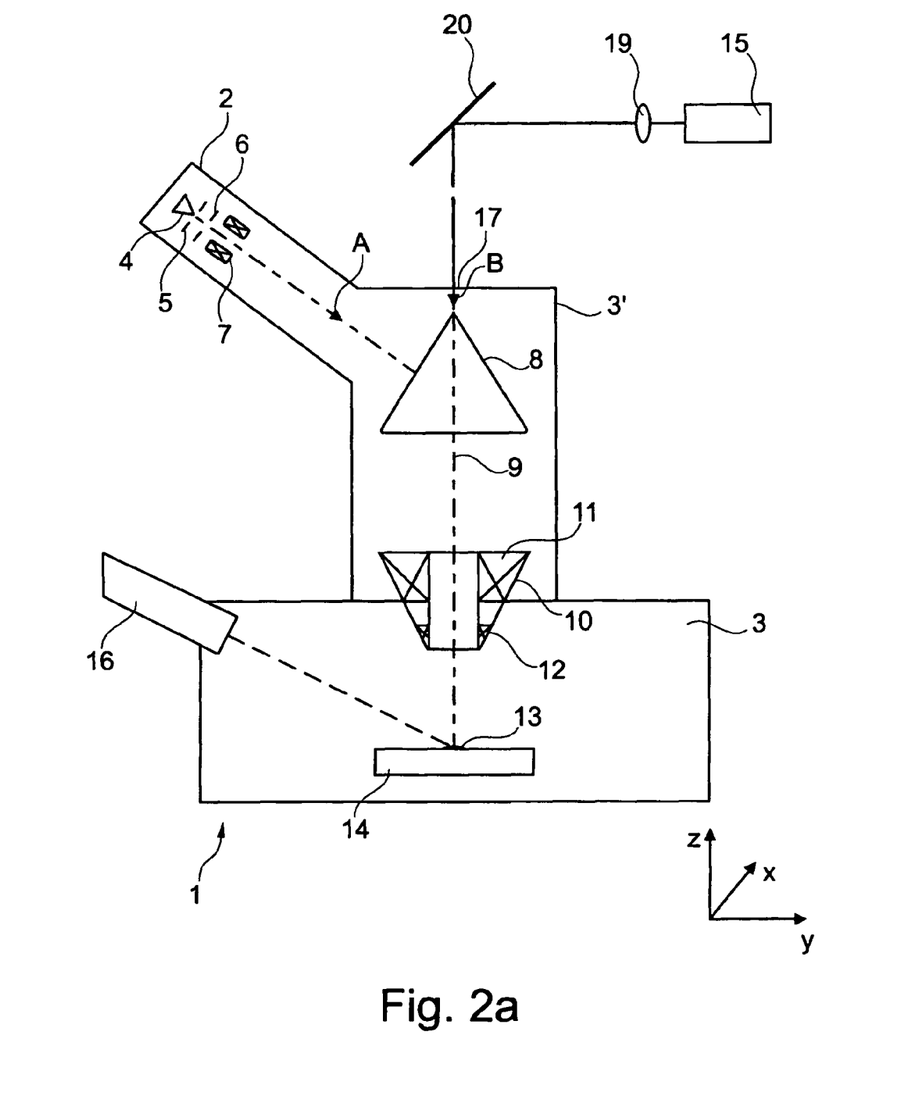
FIG. 2a shows a schematic representation of a further particle beam apparatus including a sample chamber, a light source, and a camera, which extends into the sample chamber.

FIG. 2a shows a further schematic representation of a particle beam apparatus in the form of a scanning electron microscope 1, which corresponds to the exemplary embodiment according to FIG. 1a. The same components are again provided with the same reference numerals. The exemplary embodiment according to FIG. 2a differs from the exemplary embodiment according to FIG. 1a in that the electron column chamber 3' has a slightly narrower design. In addition, the light source 15 is not situated inside the electron column chamber 3', but rather outside the electron column chamber 3'. To enable the passage of the light beam generated by the light source 15, a window 17 is provided on the electron column chamber 3'. The light source 15 is situated in such a way that it generates a light beam which initially travels perpendicularly to the extension of the particle-optical axis 9. The light beam is focused by a focusing lens 19 and then strikes a mirror 20, which deflects the light beam onto the extension of the particle-optical axis 9, so that the light beam travels through the deflection element 8 along the particle-optical axis 9. The light beam is thus oriented coaxially to the particle beam.

Figure 2B:
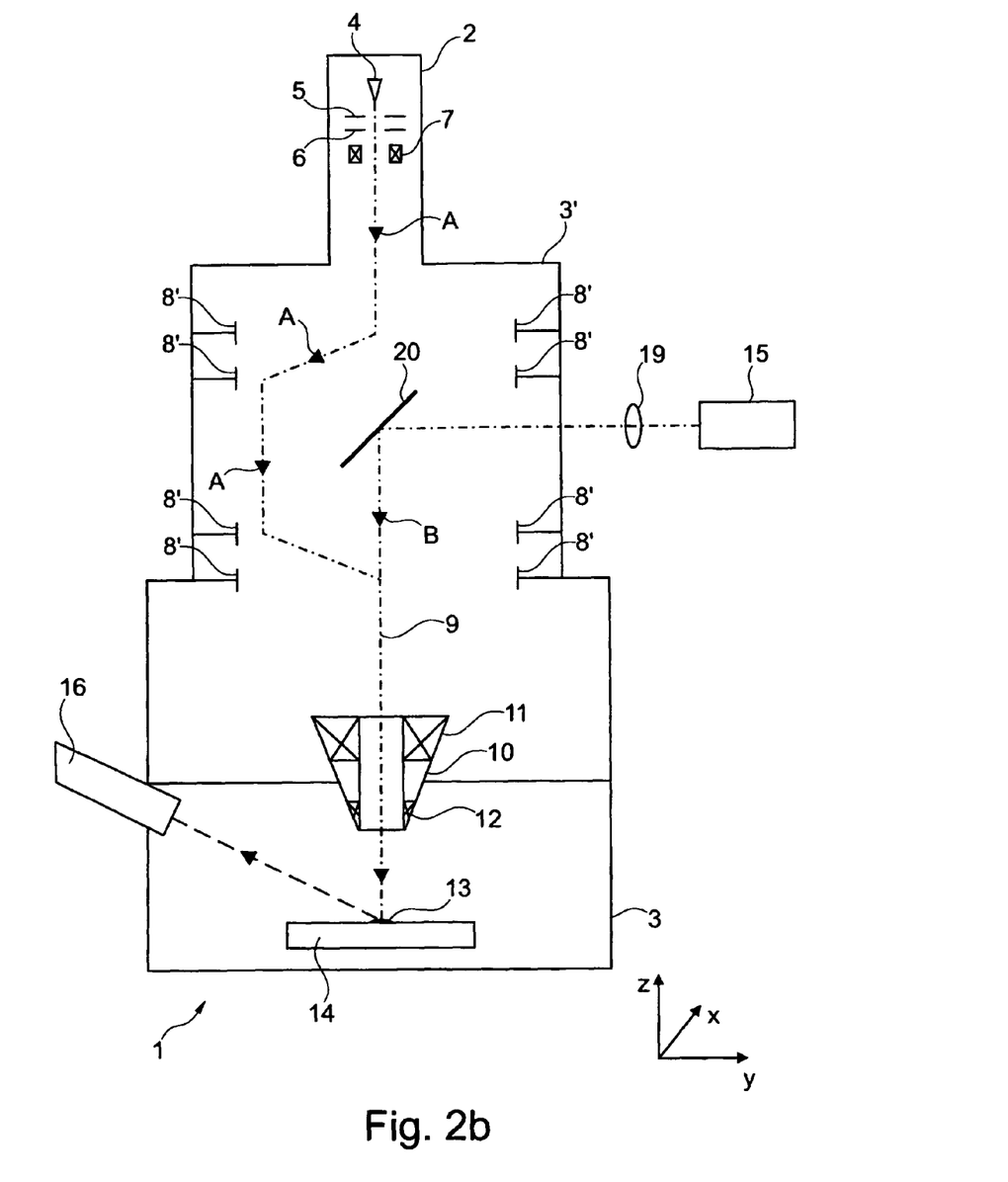
FIG. 2b shows a schematic representation of a further particle beam apparatus including a sample chamber, a light source, and a camera, which extends into the sample chamber.

FIG. 2b shows a further schematic representation of a particle beam apparatus in the form of a scanning electron microscope 1, which corresponds to the exemplary embodiment according to FIG. 1a. The same components are again provided with the same reference numerals. The exemplary embodiment according to FIG. 2b differs from the exemplary embodiment according to FIG. 1a in that the electron column chamber 3' has a slightly different design. In this exemplary embodiment, the electron column 2 is also not tilted in relation to the vertical, but instead runs along the vertical, i.e., in relation to the particle-optical axis 9. In addition, a deflection system is provided which includes four deflection unit pairs 8', the deflection unit pairs being situated sequentially from the electron column 2 in the direction of the objective lens 10 (four-stage deflection system). The deflection unit pairs 8' are used to deflect the particle beam along arrow directions A, as shown in FIG. 2b. After entering the electron column chamber 3', the particle beam is therefore initially deflected away from the particle-optical axis 9, then travels parallel to the particle-optical axis 9 and is subsequently deflected back into the particle-optical axis 9. It is necessary to deflect the particle beam outward and then back inward, since the mirror 20 is situated between the electron column 2 and the objective lens 10 on the particle-optical axis 9, this mirror being used to inject, onto the particle-optical axis 9, a light beam of the light source 15 which is situated outside the electron column chamber 3' and whose light beam is injected into the electron column chamber 3' perpendicular to the particle-optical axis 9 after being focused by the lens 19. In this exemplary embodiment, the light beam also passes through the injection area of the particle beam, which is provided in the area of the deflection unit pair 8', which is situated right next to the objective lens 10.

Reference is expressly made to the fact that the system described herein is not limited to a four-stage deflection system. Instead, any deflection system is suitable which may be used to deflect a particle beam out from an axis and then back in again, for example a three-stage deflection system.

The light source 15 illustrated in the aforementioned figures may be an incandescent bulb or a low-power laser. In an alternative embodiment, the light source 15 may be a high-power laser. In this alternative embodiment, the light source 15 is used not only to position the holder 14, and thus the object 13, but also to clean the surface of the object 13. The laser beam generated by the light source 15 is used to loosen contamination from the surface of the object 13. Contamination is subsequently removed with the aid of a gas which flows along the surface of the object 13. Argon or nitrogen may be used as the gas.

Figure 3:
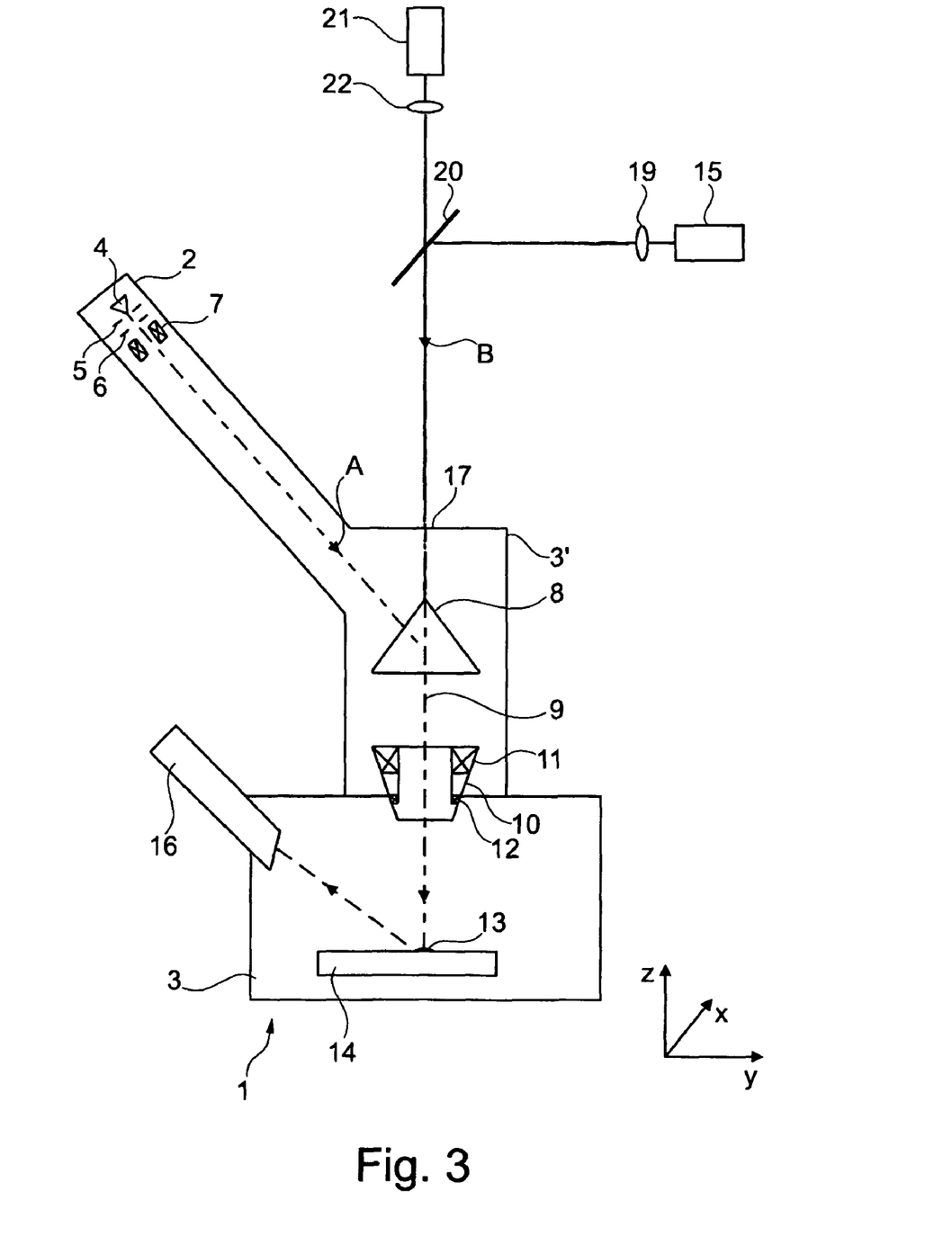
FIG. 3 shows a schematic representation of a further particle beam apparatus including a sample chamber, two light sources being provided, and a camera being situated within the sample chamber.

FIG. 3 shows a further schematic representation of a particle beam apparatus in the form of the scanning electron microscope 1, which corresponds to the exemplary embodiment according to FIG. 2a. The same components are provided with the same reference numerals. The exemplary embodiment according to FIG. 3 differs from the exemplary embodiment according to FIG. 2a only in that mirror 20 is semi-reflecting and the further light source 21 is situated on the extension of the particle-optical axis 9, this second light source 21 generating a further light beam which is guided along particle-optical axis 9 through deflection element 8 after being focused by a focusing lens 22. This light beam is thus also coaxial to the particle beam. In this exemplary embodiment, the light source 15 may be an incandescent bulb or a low-power laser which generates a light beam which is used to position the holder 14 and thus the object 13. The light source 21, on the other hand, may be a high-power laser which is used to clean the surface of the object 13, as explained above.

Figure 4:
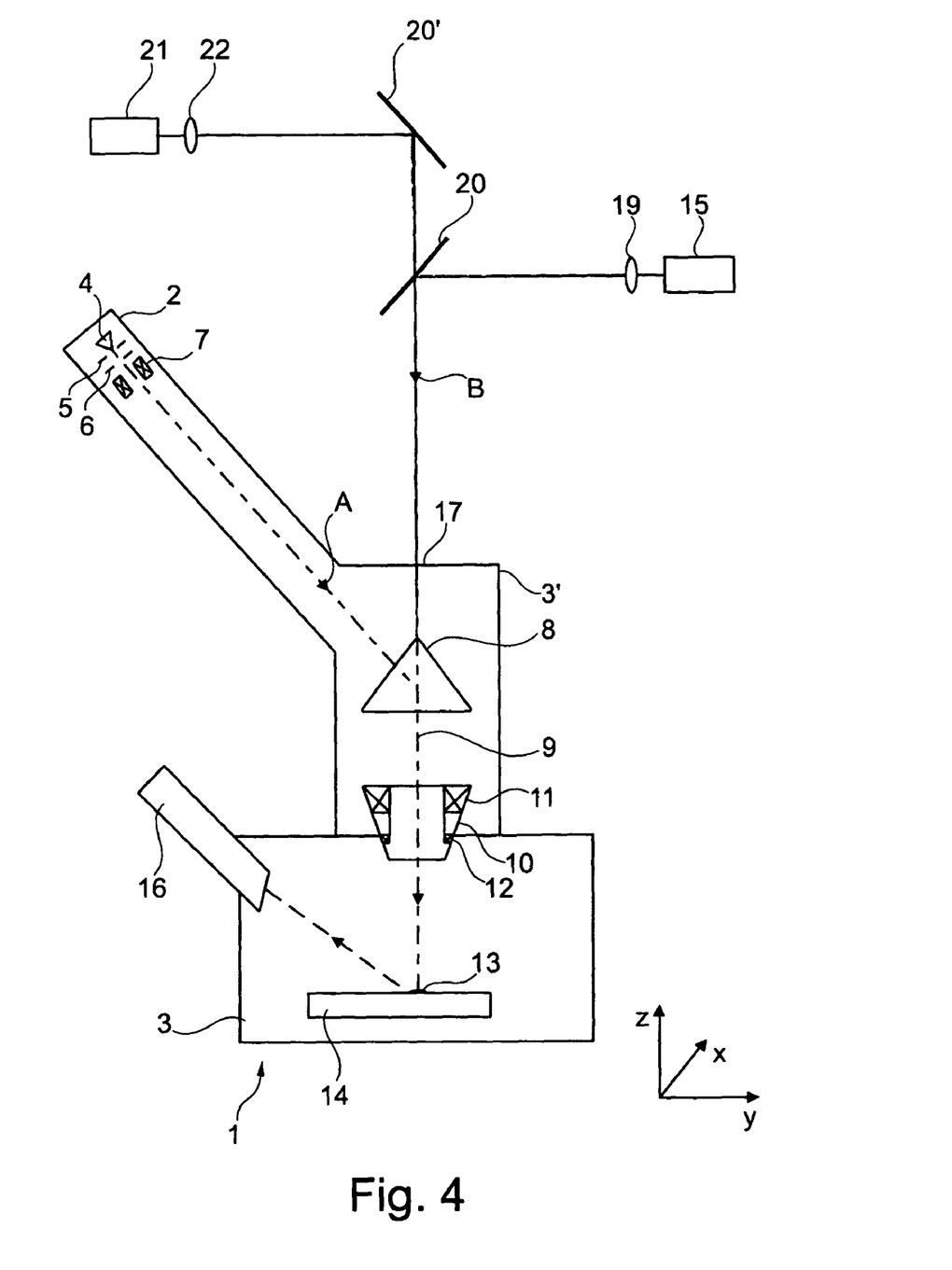
FIG. 4 shows a schematic representation of a further particle beam apparatus including a sample chamber, two light sources being provided, and a camera being situated within the sample chamber.

FIG. 4 shows a further schematic representation of a particle beam apparatus in the form of a scanning electron microscope 1, which corresponds to the exemplary embodiment according to FIG. 3. The same components are again provided with the same reference numerals. The exemplary embodiment according to FIG. 4 differs from the exemplary embodiment according to FIG. 3 in that the mirror 20 is provided with a hole through which a light beam of the light source 21 passes and is deflected onto the extension of the particle-optical axis 9 using a further mirror 20' after being focused by the lens 22. The light beam of the light source 15 is reflected only outside the hole in the mirror 20, so that it has a central obscuration which does not interfere with anything.

Figure 5:
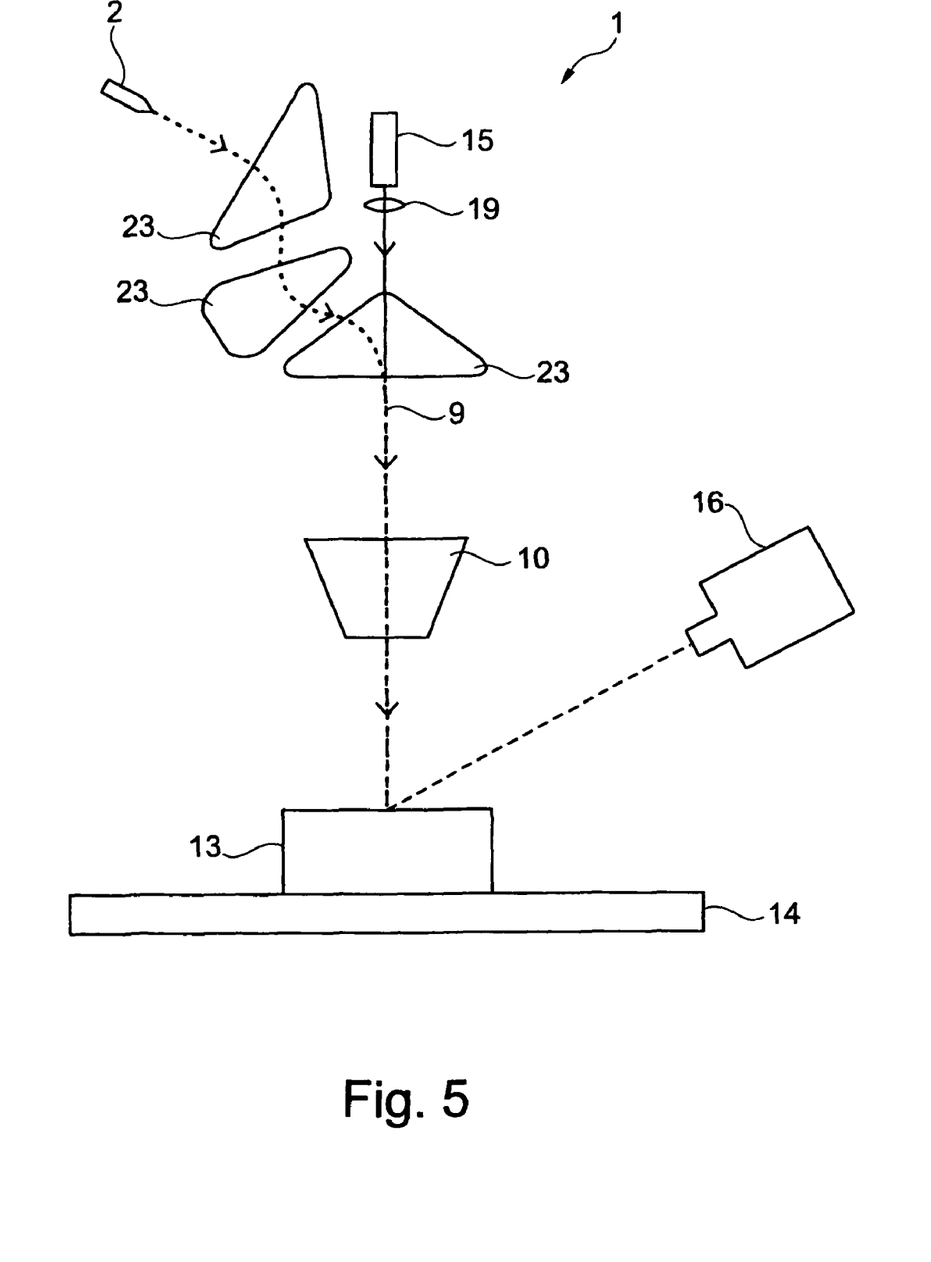
FIG. 5 shows a schematic representation of a further particle beam apparatus which includes deflection elements for a particle beam.

FIG. 5 shows a schematic representation of a further particle beam apparatus in the form of a scanning electron microscope 1, which has a structure corresponding to that of the exemplary embodiment according to FIG. 1a. For the sake of clarity, however, FIG. 5 does not show a sample chamber or an electron column chamber, which, however, are provided in the exemplary embodiment illustrated in FIG. 5. The same components are provided with the same reference numerals. The scanning electron microscope 1 according to FIG. 5 includes an the electron column 2 which is provided with the aforementioned components. Using three deflection elements 23 in the form of coil elements, a particle beam generated in the electron column 2 in the form of an electron beam is first deflected multiple times in different directions before it is deflected onto the particle-optical axis 9 by the deflection element 23 situated on the particle-optical axis 9 or on the extension of the particle-optical axis 9. This deflection element 23 therefore represents an area in which the particle beam is injected into the particle-optical axis 9 (injection area) and travels subsequently along the particle-optical axis 9. The particle beam thus again runs coaxially to the light beam provided by the light source 15, making it possible to achieve the aforementioned effect.

Figure 6:
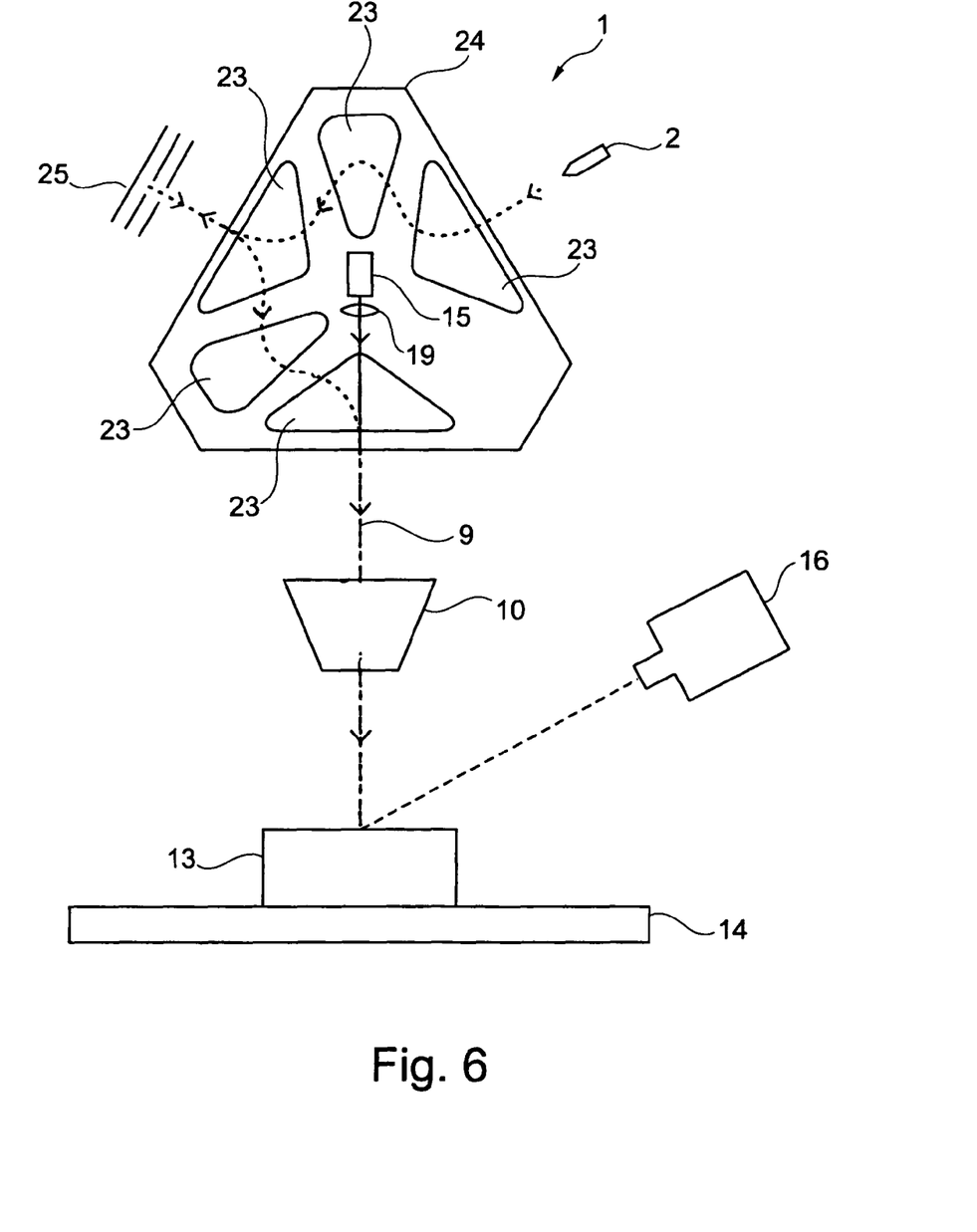
FIG. 6 shows a schematic representation of a particle beam apparatus which includes a beam splitter and a mirror corrector.

FIG. 6 shows a schematic representation of a further particle beam apparatus in the form of a scanning electron microscope 1, which has a structure corresponding to that of the exemplary embodiment according to FIG. 5. The same components are provided with the same reference numerals. Instead of three deflection elements 23, however, the scanning electron microscope 1 according to FIG. 6 has a beam splitter 24, which is provided with five deflection elements 23 in the form of coil elements. Using the deflection elements 23, the particle beam generated in the electron column 2 is first deflected multiple times in different directions before it exits the beam splitter 24 and is guided to a mirror corrector 25. The particle beam is then guided back to the beam splitter 24 and deflected via further deflection elements 23, the deflection element 23 situated on the extension of the particle-optical axis 9 deflecting the particle beam in the direction of and along the particle-optical axis 9. This deflection element 23 thus again provides the injection area. Once again, the light beam generated by the light source 15 travels through the deflection element 23 situated on the extension of the particle-optical axis 9, so that the particle beam and the light beam run coaxially to achieve the aforementioned effect.

Figure 7:
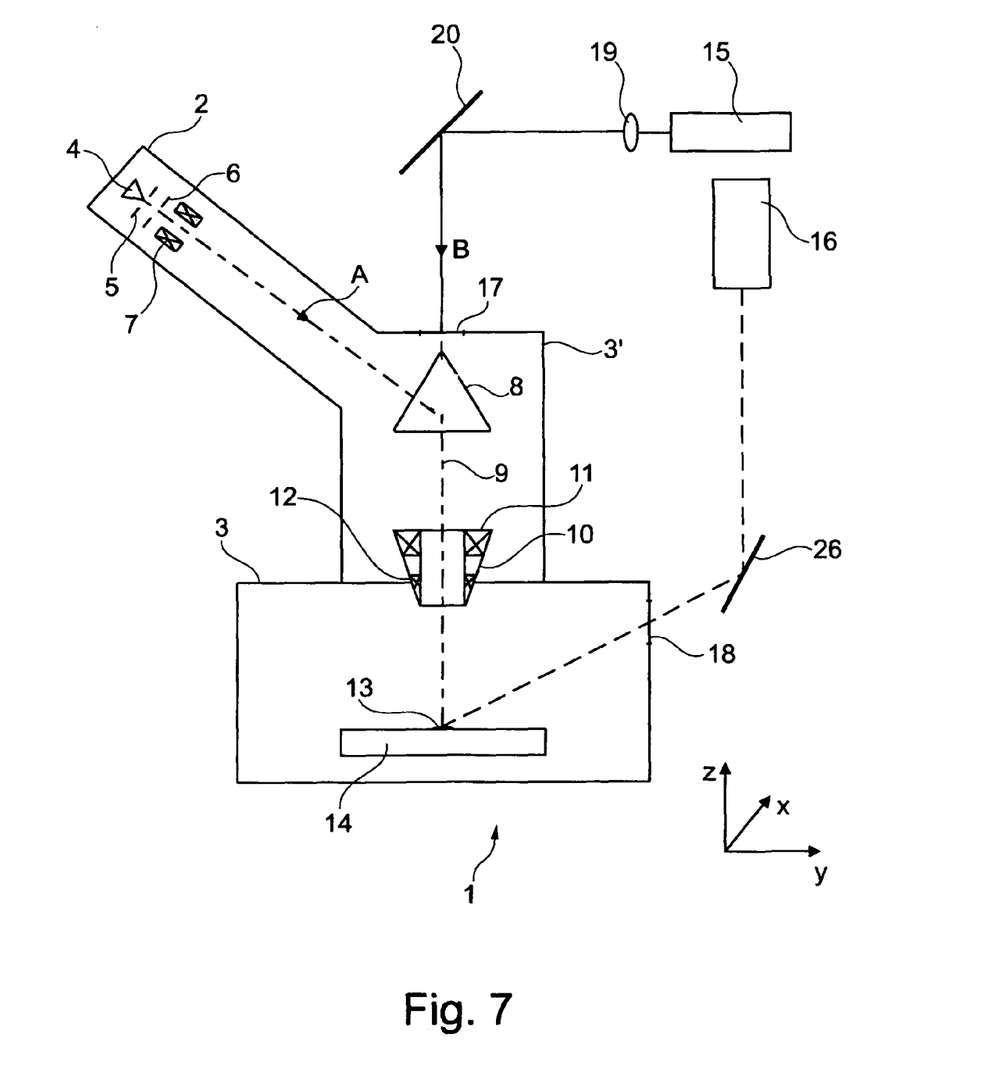
FIG. 7 shows a schematic representation of a particle beam apparatus including a sample chamber, a light source, and a camera, which is situated outside the sample chamber.

FIG. 7 shows a further schematic representation of a particle beam apparatus in the form of the scanning electron microscope 1, which corresponds to the exemplary embodiment according to FIG. 2a. The same components are provided with the same reference numerals. The exemplary embodiment according to FIG. 7 differs from the exemplary embodiment according to FIG. 2a in that the detector in the form of the CCD camera 16 is not situated within the sample chamber 3, but in the area of the light source 15. The sample chamber 3 has a window 18, through which the light beam reflected by the object 13 passes and strikes a deflection element in the form of a mirror 26, which guides the light beam to the CCD camera 16. In this exemplary embodiment, the mirror 26 is a detector element which belongs to the CCD camera 16, but which is not situated at the position of the CCD camera 16. The same applies to the mirror 20, which is a light source element and belongs to the light source 15, but which is not situated at the position of the light source 15.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A positioning device for a particle beam apparatus, comprising:
   at least one positionable holder for holding an object;
   at least one light source for generating a light beam which is guidable in the direction of the positionable holder;
   at least one detector for detecting the light beam; and
   at least one injection area in which particles of a particle beam are injected, wherein the particles are guidable in the direction of the positionable holder, wherein the light beam passes through the injection area, wherein the injection area has an output side for the light beam and the particle beam, the output side being directed toward the holder, wherein the detector includes a detector element disposed in an area between the output side of the injection area and the holder, and wherein the light source includes a light source element disposed in an area which extends away from the holder, starting from the output side.

2. The positioning device as recited in claim 1, wherein, at least one of the detector element is disposed on the detector and the light source element is disposed on the light source.

3. The positioning device as recited in claim 1, wherein the injection area is disposed on a particle-optical axis of the particle beam apparatus, and both the light beam and the injected particles are guided on the particle-optical axis.

4. The positioning device as recited in claim 3, wherein the light source is disposed on the particle-optical axis.

5. The positioning device as recited in claim 3, further comprising:
   at least one guide device that guides the light beam on the particle-optical axis.

6. The positioning device as recited in claim 5, wherein the guide device is a deflection element.

7. The positioning device as recited in claim 6, wherein the deflection element is at least one of: a mirror element and a prism.

8. The positioning device as recited in claim 1, wherein the light beam and the particle beam formed from the injected particles are oriented approximately coaxially to each other.

9. The positioning device as recited in claim 1, further comprising:
   at least one deflector that injects the particles of the particle beam.

10. The positioning device as recited in claim 9, wherein the deflector is at least one of: a magnetic deflector and an electrostatic deflector.

11. The positioning device as recited in claim 9, wherein the deflector is a beam splitter.

12. The positioning device as recited in claim 1, wherein the light source is a laser.

13. The positioning device as recited in claim 1, further comprising:
   an objective lens having a charged particle optical axis, wherein the injection area includes a deflection element, wherein the light beam passes through the deflection element along the charged particle optical axis, and wherein the deflection element deflects the particle beam into a direction of the charged particle optical axis after the light beam has been injected to run along the charged particle optical axis.

14. A positioning device for a particle beam apparatus, comprising:
   at least one positionable holder for holding an object;
   at least one light source for generating a light beam which is guidable in the direction of the positionable holder;
   at least one detector for detecting the light beam; and
   at least one injection area in which particles of a particle beam are injected, wherein the particles are guidable in the direction of the positionable holder, wherein the light beam passes through the injection area, wherein the injection area has an output side for the light beam and the particle beam, the output side being directed toward the holder, wherein the detector includes a detector element disposed in an area between the output side and the holder, wherein the light source includes a light source element disposed in an area which extends away from the holder, starting from the output side, and wherein at least one of the following is further provided:
   (i) wherein the light beam is provided both for positioning the positionable holder and for cleaning an object which is disposed on the positionable holder; or
   (ii) wherein at least two light sources are provided for generating light beams, namely a first light source for generating a first light beam and a second light source for generating a second light beam, wherein the first light beam is provided for positioning the positionable holder, and wherein the second light beam is provided for cleaning an object which is disposed on the positionable holder.

15. A particle beam apparatus, comprising:
   at least one particle beam generator for generating a particle beam;
   at least one positionable holder for holding an object;
   at least one objective for focusing the particle beam onto the object;
   at least one light source for generating a light beam for illuminating the object;
   at least one detector for detecting the light beam; and
   at least one injection area for injecting the particle beam in such a way that the particle beam is guidable in the direction of the positionable holder, wherein the light beam passes through the injection area, wherein the injection area has an output side for the light beam and the particle beam, the output side being directed toward the holder, wherein the detector includes a detector element disposed in an area between the output side of the injection area and the holder, and wherein the light source includes a light source element disposed in an area which extends away from the holder, starting from the output side.

16. The particle beam apparatus as recited in claim 15, wherein, at least one of: the detector element is disposed on the detector and the light source element is disposed on the light source.

17. The particle beam apparatus as recited in claim 15, wherein at least one of: the detector element and the light source element is a deflection element.

18. The particle beam apparatus as recited in claim 15, wherein the injection area is disposed on a particle-optical axis of the particle beam apparatus, and both the light beam and the particle beam are guided on the particle-optical axis.

19. The particle beam apparatus as recited in claim 18, wherein the light source is disposed on the particle-optical axis.

20. The particle beam apparatus as recited in claim 18, further comprising:
at least one guide device that guides the light beam of the light source onto the particle-optical axis.

21. The particle beam apparatus as recited in claim 20, wherein the guide device is a deflection element.

22. The particle beam apparatus as recited in claim 21, wherein the deflection element is at least one of: a mirror element and a prism.

23. The particle beam apparatus as recited in claim 15, wherein the light beam and the particle beam are oriented approximately coaxially to each other.

24. The particle beam apparatus as recited in claim 15, further comprising:
at least one deflector that injects the particle beam.

25. The particle beam apparatus as recited in claim 24, wherein the deflector is at least one of: a magnetic deflector and an electrostatic deflector.

26. The particle beam apparatus as recited in claim 24, wherein the deflector is a beam splitter.

27. The particle beam apparatus as recited in claim 15, wherein the light source is a laser.

28. The particle beam apparatus as recited in claim 15, further comprising:
at least one sample chamber, wherein the positionable holder and the detector are disposed within the sample chamber.

29. The particle beam apparatus as recited in claim 15, further comprising:
at least one sample chamber, wherein the positionable holder is disposed within the sample chamber, and wherein the detector is disposed outside the sample chamber.

30. The particle beam apparatus as recited in claim 15, wherein the particle beam apparatus is a scanning electron microscope.

31. The particle beam apparatus as recited in claim 15, further comprising:
an objective lens having a charged particle optical axis, wherein the injection area includes a deflection element, wherein the light beam passes through the deflection element along the charged particle optical axis, and wherein the deflection element deflects the particle beam into a direction of the charged particle optical axis after the light beam has been injected to run along the charged particle optical axis.

32. A particle beam apparatus, comprising:
at least one particle beam generator for generating a particle beam;
at least one positionable holder for holding an object;
at least one objective for focusing the particle beam onto the object;
at least one light source for generating a light beam for illuminating the object;
at least one detector for detecting the light beam; and
at least one injection area for injecting the particle beam in such a way that the particle beam is guidable in the direction of the positionable holder, wherein the light beam passes through the injection area, wherein the injection area has an output side for the light beam and the particle beam, the output side being directed toward the holder, wherein the detector includes a detector element disposed in an area between the output side and the holder, wherein the light source includes a light source element disposed in an area which extends away from the holder, starting from the output side, and wherein at least one of the following is further provided:
(i) wherein the light beam is provided both for positioning the positionable holder and for cleaning an object disposed on the positionable holder; or
(ii) wherein at least two light sources are provided for generating light beams, namely a first light source for generating a first light beam and a second light source for generating a second light beam, wherein the first light beam is provided for positioning the positionable holder, and wherein the second light beam is provided for cleaning an object disposed on the positionable holder.

* * * * *